(12) United States Patent
Boreysha et al.

(10) Patent No.: US 7,161,429 B2
(45) Date of Patent: Jan. 9, 2007

(54) MULTI-PORT CROSS-CONNECTED MULTI-LEVEL CASCODE DIFFERENTIAL AMPLIFIER

(75) Inventors: Liby Boreysha, Migdal Haemek (IL); Yuri Bruck, Carmiel (IL); Gennady Burdo, Maalot (IL); Michael Zelikson, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 382 days.

(21) Appl. No.: 10/739,781

(22) Filed: Dec. 18, 2003

(65) Prior Publication Data

US 2005/0134379 A1 Jun. 23, 2005

(51) Int. Cl.
*H03F 3/45* (2006.01)
(52) U.S. Cl. ...................................... 330/252; 330/311
(58) Field of Classification Search ..................... None
See application file for complete search history.

(56) References Cited

U.S. PATENT DOCUMENTS

| | | | |
|---|---|---|---|
| 2,663,806 A | 12/1953 | Darlington | 330/311 |
| 4,319,198 A | 3/1982 | Sosin | 330/296 |
| 5,032,799 A | 7/1991 | Milberger et al. | 330/311 |
| 5,945,879 A | 8/1999 | Rodwell et al. | 330/310 |
| 6,025,742 A * | 2/2000 | Chan | 330/253 |
| 6,137,367 A | 10/2000 | Ezzedine et al. | 330/311 |
| 6,590,422 B1 * | 7/2003 | Dillon | 330/253 |

OTHER PUBLICATIONS

Fraysse, J. Ph. et al., "A 2W, High Efficiency, 2-8GHz, Cascode HBT MMIC Power Distributed Amplifier", 2000 IEEE MTT-S Digest, pp. 529-532.
Sackinger, E. et al., "A High-Swing, High-Impedance MOS Cascode Circuit", IEEE Journal of Solid-State Circuit, V.25, No. 1, Feb. 1990, pp. 289-298.
Nauta, B., "A CMOS Transconductance-C Filter Technique for Very High Frequencies", IEEE Journal of Solid State Circuits, vol. 27, No. 2, Feb. 1992, pp. 142-153.

* cited by examiner

*Primary Examiner*—Khanh V. Nguyen
(74) *Attorney, Agent, or Firm*—Stephen C. Kaufman

(57) ABSTRACT

A differential cascode amplifier has first and second cascode circuits, driven by two differential signal sources including input resistances.

The first cascode circuit includes a first input transistor having a first collector, a first emitter, and a first base, and a first output transistor having a second collector, a second base, and a second emitter coupled to the first collector. The second cascode circuit includes a second input transistor having a third collector, a third emitter, and a third base, and a second output transistor having a fourth collector, a fourth base, and a fourth emitter coupled to the third collector. The amplifier has a first connection connecting the first base to the fourth base, and a second connection connecting the second base to the third base.

This cross-connected differential cascode architecture provides doubled output bandwidth and current gain (in dB), further increasing input impedance and output swing.

25 Claims, 6 Drawing Sheets

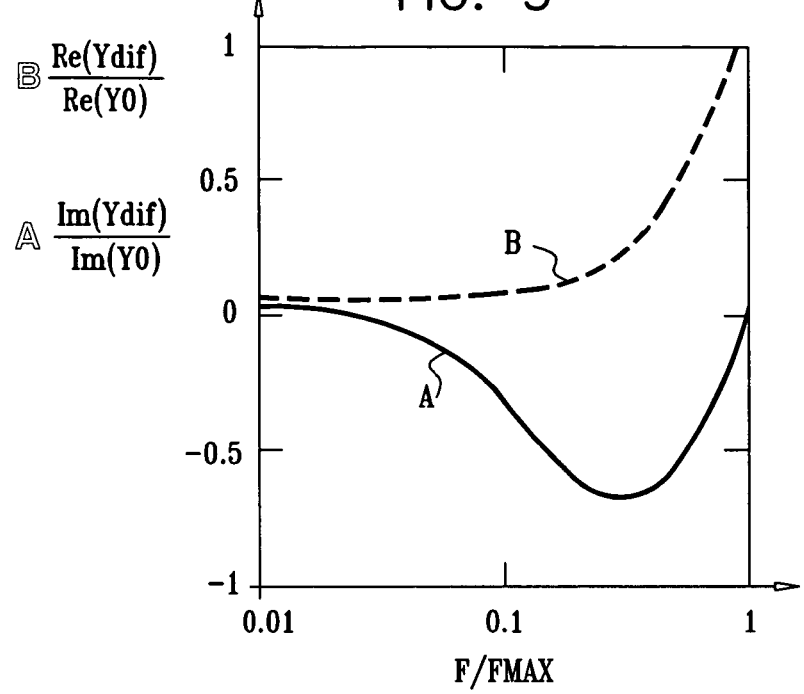
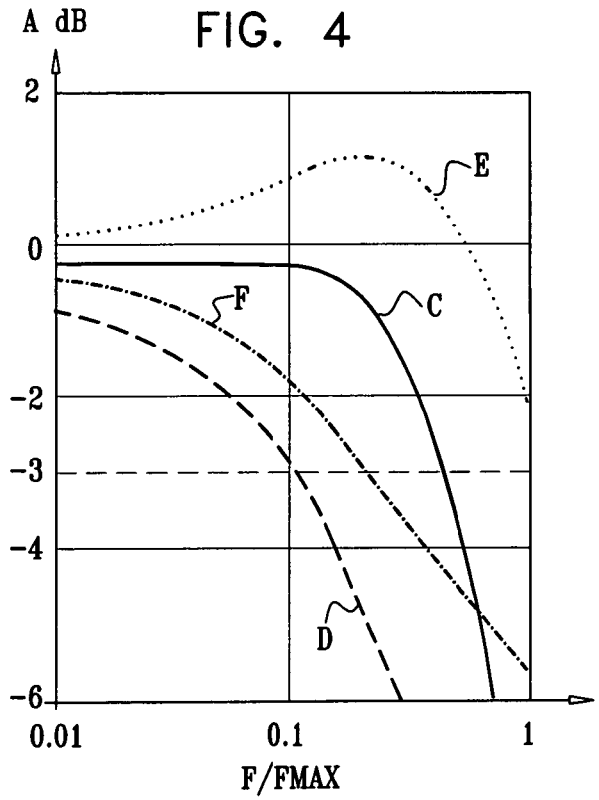

MULTI-PORT CROSS-CONNECTED MULTI-LEVEL CASCODE DIFFERENTIAL AMPLIFIER

FIELD OF THE INVENTION

The present invention relates generally to amplifiers, and specifically to configurations of cascode amplifiers to achieve high performance.

BACKGROUND OF THE INVENTION

A single transistor, when used as an amplifier, may typically have a relatively low current gain and input impedance, especially as the signal frequency increases. One of the earliest transistor circuits to correct this problem was described in U.S. Pat. No. 2,663,806 to Darlington, whose disclosure is incorporated herein by reference. The disclosure shows a number of different configurations of pairs of transistors for increasing the gain and input impedance of transistor circuits, some of which became known as "Darlington Pairs."

As transistors in an integrated circuit (IC) are reduced in size, further limitations such as reduced maximum allowable voltage drop place increased constraints on the performance of the IC. For an IC operating as an amplifier, the constraints, especially for high frequency amplifiers, lead to low output signal amplitude per amplifier stage.

Transistor cascode circuits, in which two or more transistors are connected in a series configuration, i.e., with a collector/drain of a first transistor connected to an emitter/source of a second transistor, are well known for being able to overcome some of the limitations described above. For example, U.S. Pat. No. 4,319,198 to Sosin, whose disclosure is incorporated herein by reference, describes a cascode-type amplifier in which the bases of the transistors are connected by a potential divider consisting of reactive components.

U.S. Pat. No. 5,032,799 to Milberger et al., whose disclosure is incorporated herein by reference, describes a radio frequency (RF) amplifier comprising a control amplifier connected to one or more "clone" amplifiers, all the amplifiers being connected in a cascode configuration. Each clone amplifier is configured to have unity gain, and biasing to the bases of the amplifiers is provided by one or more resistor chains.

U.S. Pat. No. 5,945,879 to Rodwell et al., whose disclosure is incorporated herein by reference, describes a cascode power amplifier, each stage of which has local negative feedback. The stages are coupled together with capacitors, obviating DC level restrictions for the individual stages.

U.S. Pat. No. 6,137,367 to Ezzedine et al., whose disclosure is incorporated herein by reference, describes DC and AC coupled multi-level cascode power amplifiers. In all the amplifiers transistor gates receive feedback from the drain of an output transistor in the cascode, via a resistor-capacitor network. The network sets levels of DC and AC signals applied to the gates.

U.S. Pat. No. 6,529,075 to Bruck et al., whose disclosure is incorporated herein by reference, describes a differential amplifier including cascode circuitry in two branches of the amplifier to cancel second and third harmonics of the output signal.

U.S. Pat. No. 6,366,172 to Hayashi et al., whose disclosure is incorporated herein by reference, describes a cascode amplifier in which the negative characteristic of an output conductance improves the conductance of the cascode.

In an article by Fraysse et al., entitled "A 2W, High Efficiency, 2–8 GHz, Cascode HBT MMIC Power Distributed Amplifier," in 2000 *IEEE MTT-S Digest*, Volume 1, June 2000, Page(s): 529–532, and whose disclosure is incorporated herein by reference, a special circuit topology to increase output signal swing for wideband power distributed amplifiers, based on cascode cells, is described.

An article by Sackinger et al., entitled "A High-Swing, High-Impedance MOS Cascode Circuit," *IEEE Journal of Solid-State Circuit*, 25(1), February 1990, whose disclosure is incorporated herein by reference, describes a cascode circuit in which the gate voltage of one of the cascode transistors is controlled by a feedback amplifier to increase output impedance.

An article by Deibele et al., entitled "Attenuation Compensation in Distributed Amplifier Design," *IEEE Trans. on MTT*, 37(9), September 1989, whose disclosure is incorporated herein by reference, evaluates the use of negative resistance and capacitance of FET-based cascode circuits to increase gain-bandwidth product in distributed amplifiers, and compares the performance of these amplifiers with distributed amplifiers that do not include cascodes.

Notwithstanding the circuits of the prior art described above, limitations of cascode circuitry, including limitations on the current gain, the input impedance, the bandwidth, and the allowable signal swing, still exist.

SUMMARY OF THE INVENTION

Some preferred embodiments of the present invention provide a differential amplifier using cascode circuitry in two branches of the amplifier. The common emitter/source and common base/gate inputs of the two branches are cross-connected, the cross-connections increasing the current gain, the input impedance, and the bandwidth of the amplifier.

Further preferred embodiments provide a multi-level cascode amplifier, where a first level of common base/gate cascade stages is cross-connected with a common emitter/source input stage. Further common base/gate levels are biased with a proportional level of an input signal. As a result, a final output of the amplifier may have a higher signal swing than that allowed by the individual levels of the amplifier. The differential, cross-connected cascode amplifier of the present invention may be used in this sort of multi-level configuration.

In disclosed embodiments of the present invention, the differential amplifier comprises two cascode circuits, each cascode circuit in turn comprising an input transistor connected in series to an output transistor. The base/gate of each cascode circuit's input transistor is cross-connected to the base/gate of the output transistor of the other cascode circuit, with appropriate DC adjustment. The two cross-connections provide a simple and effective way to decrease the required input current in each cascode circuit. The decreased input current in turn increases the amplifier current gain and also its input impedance. The bandwidth of the amplifier also increases compared to conventional cascode amplifiers.

Most preferably, each cascode circuit comprises additional transistors connected in series between input and output transistors, forming two multi-level cascode amplifiers. Each multi-level amplifier is configured so that DC and AC levels can be independently applied to the base/gate of each additional transistor by circuitry coupled to each base. DC levels are applied so that each transistor is biased optimally. AC levels, related to an AC input value, are also applied to the bases/gates so as to generate a greater output than would be possible from a single level cascode circuit.

Further preferred embodiments provide a high quality differential filter or transmission line. A filter or transmission line is connected in parallel to the input of a cross-connected cascode amplifier. Losses in the filter or transmission line are compensated by the negative real part of the input conductance of the cross-connected cascode amplifier.

There is therefore provided, according to a preferred embodiment of the present invention, a differential amplifier including:

a first cascode circuit including:

a first input transistor having a first collector, a first emitter, and a first base; and a first output transistor having a second collector, a second base, and a second emitter coupled to the first collector;

a second cascode circuit including:

a second input transistor having a third collector, a third emitter, and a third base; and a second output transistor having a fourth collector, a fourth base, and a fourth emitter coupled to the third collector;

a first connection that connects the first base to the fourth base; and a second connection that connects the second base to the third base.

The first connection preferably includes a first direct current (DC) biasing circuit that generates a first DC potential difference between the first base and the fourth base, and the second connection preferably includes a second DC biasing circuit that generates a second DC potential difference between the second base and the third base.

The amplifier preferably also includes an input circuit which generates a first input signal input to the first base, and a second input signal substantially 180° out of phase with the first signal, and input to the third base, and a first differential signal is output at the second collector, and a second differential signal is output at the fourth collector.

The amplifier preferably includes an input circuit which generates a first input signal, input to the first base, and a second input signal input to the third base, such that a first emitter current of the first emitter is reduced in response to the second input signal, and such that a second emitter current of the third emitter is reduced in response to the first input signal, and wherein a first differential signal is output at the second collector, and a second differential signal is output at the fourth collector.

Preferably, the amplifier includes:

a plurality of first series transistors, configured as common base (CB) amplifiers and connected in a first series with the first output transistor, each of the first series transistors having a respective fifth collector, a respective fifth base and a respective fifth emitter, the plurality of the first series transistors including:

a fifth transistor, connected at an initial position in the first series, such that the fifth emitter of the fifth transistor is connected to the second collector; and one or more sixth transistors, connected subsequent to the fifth transistor in the first series, such that the fifth emitter of each of the sixth transistors is connected to the fifth collector of a preceding one of the first series transistors, and a first output signal is generated at the fifth collector of a final one of the sixth transistors in the first series;

a plurality of second series transistors, configured as CB amplifiers and connected in a second series with the second output transistor, each of the second series transistors comprising a respective sixth collector, a respective sixth base and a respective sixth emitter, the plurality of the second series transistors consisting of:

a seventh transistor, connected at an initial position in the second series, such that the sixth emitter of the seventh transistor is connected to the fourth collector; and one or more eighth transistors, connected subsequent to the seventh transistor in the second series, such that the sixth emitter of each of the eighth transistors is connected to the sixth collector of a preceding one of the second series transistors, and a second output signal is generated at the sixth collector of a final one of the eighth transistors in the second series;

a first input circuit, which is coupled to receive a first input signal and to provide, responsively to the first input signal, respective inputs to the first base and to the fifth base of each of the first series transistors, such that each of the respective inputs to the first series transistors is proportional to the first input signal in a proportion responsive to a position of each of the first series transistors in the first series; and a second input circuit, which is coupled to receive a second input signal and to provide, responsively to the second input signal, respective inputs to the third base and to the sixth base of each of the second series transistors, such that each of the respective inputs to the second series transistors is proportional to the second input signal in a proportion responsive to a position of each of the second series transistors in the second series.

The amplifier preferably further includes:

first direct current (DC) biasing circuits which provide respective first DC inputs to the fifth bases of the first series transistors, such that each of the respective first DC inputs is proportional to a maximum collector-base potential in a proportion responsive to a position of each of the first series transistors in the first series; and second DC biasing circuits which provide respective second DC inputs to the seventh bases of the second series transistors, such that each of the respective second DC inputs is proportional to the maximum collector-base potential in a proportion responsive to the position of each of the second series transistors in the second series.

Preferably, the respective first DC inputs are independent of the first input signal, and the respective second DC inputs are independent of the second input signal.

The amplifier preferably includes:

a fifth transistor, configured as a common base (CB) amplifier and connected in series with the first output transistor, the fifth transistor having a fifth collector, a fifth base and a fifth emitter connected to the second collector, such that a first output signal is generated at the fifth collector;

a sixth transistor, configured as a CB amplifier and connected in series with the second output transistor, the sixth transistor having a sixth collector, a sixth base and a sixth emitter connected to the fourth collector, such that a second output signal is generated at the sixth collector;

a first input circuit, which is coupled to receive a first input signal and to provide, responsively to the first input signal, substantially similar inputs to the first base and to the fifth base; and a second input circuit, which is coupled to receive a second input signal and to provide, responsively to the second input signal, substantially similar inputs to the third base and to the sixth base.

The amplifier preferably further includes:

a first direct current (DC) biasing circuit which provides a first DC input to the fifth base, such that the first DC input is proportional to a maximum collector-base potential; and a second DC biasing circuit which provides a second DC input to the sixth base, such that the second DC input is proportional to the maximum collector-base potential.

Preferably, the respective first DC input is independent of the first input signal, and the second DC input is independent of the second input signal.

There is further provided, according to a preferred embodiment of the present invention, a method for amplifying a differential signal, including:

providing a first cascode circuit consisting of:

a first input transistor having a first collector, a first emitter, and a first base; and a first output transistor having a second collector, a second base, and a second emitter coupled to the first collector;

providing a second cascode circuit consisting of:

a second input transistor having a third collector, a third emitter, and a third base; and a second output transistor having a fourth collector, a fourth base, and a fourth emitter coupled to the third collector;

connecting the first base to the fourth base;

connecting the second base to the third base;

inputting the differential signal to the first base and the third base; and outputting an amplified differential signal from the second collector and the fourth collector.

Preferably, connecting the first base to the fourth base includes generating a first direct current (DC) potential difference between the first base and the fourth base, and connecting the second base to the third base includes generating a second DC potential difference between the second base and the third base.

The differential signal preferably includes a first input signal coupled to the first base, and a second input signal substantially 180° out of phase with the first signal input coupled to the third base.

The method preferably includes reducing a first emitter current of the first emitter in response to the second input signal, and reducing a second emitter current of the third emitter in response to the first input signal.

There is further provided, according to a preferred embodiment of the present invention, a method for amplifying a differential signal, including:

providing a first cascode circuit consisting of:

a first input transistor having a first collector, a first emitter, and a first base; and a first output transistor having a second collector, a second base, and a second emitter coupled to the first collector;

providing a second cascode circuit consisting of:

a second input transistor having a third collector, a third emitter, and a third base; and a second output transistor having a fourth collector, a fourth base, and a fourth emitter coupled to the third collector;

connecting the first base to the fourth base;

connecting the second base to the third base;

configuring a plurality of first series transistors as first common base (CB) amplifiers and connecting the first CB amplifiers in a first series with the first output transistor, each of the first series transistors having a respective fifth collector, a respective fifth base and a respective fifth emitter, the plurality of the first series transistors including:

a first-series-initial transistor, connected at an initial position in the first series, such that the fifth emitter of the first-series-initial transistor is connected to the second collector; and one or more first-series-subsequent transistors, connected subsequent to the first-series-initial transistor, such that the fifth emitter of each of the first-series-subsequent transistors is connected to the fifth collector of a preceding one of the first-series-subsequent transistors, and a first output signal is generated at the fifth collector of a final one of the first-series-subsequent transistors;

configuring a plurality of second series transistors as second CB amplifiers and connecting the second CB amplifiers in a second series with the second output transistor, each of the second series transistors having a respective sixth collector, a respective sixth base and a respective sixth emitter, the plurality of the second series transistors including:

a second-series-initial transistor, connected at an initial position in the second series, such that the sixth emitter of the second-series-initial transistor is connected to the fourth collector; and one or more second-series-subsequent transistors, connected subsequent to the second-series-initial transistor in the second series, such that the sixth emitter of each of the second-series-subsequent transistors is connected to the sixth collector of a preceding one of the second-series-subsequent transistors in the second series, and a second output signal is generated at the sixth collector of a final one of the second-series-subsequent transistors in the second series;

receiving a first input signal and providing, responsively to the first input signal, respective inputs to the first base and to the fifth base of each of the first series transistors, such that each of the respective inputs to the first series transistors is proportional to the first input signal in a proportion responsive to a position of each of the first series transistors in the first series; and receiving a second input signal and providing, responsively to the second input signal, respective inputs to the third base and to the sixth base of each of the second series transistors, such that each of the respective inputs to the second series transistors is proportional to the second input signal in a proportion responsive to a position of each of the second series transistors in the second series.

The method preferably further includes:

providing respective first DC inputs to the fifth bases of each of the first series transistors, such that each of the respective first DC inputs is proportional to a maximum collector-base potential in a proportion responsive to a position of each of the first series transistors in the first series; and providing respective second DC inputs to the seventh bases of each of the second series transistors, such that each of the respective second DC inputs is proportional to the maximum collector-base potential in a proportion responsive to the position of each of the second series transistors in the second series.

Preferably, the respective first DC inputs are independent of the first input signal, and the respective second DC inputs are independent of the second input signal.

There is further provided, according to a preferred embodiment of the present invention, a method for amplifying a differential signal, including:

providing a first cascode circuit consisting of:

a first input transistor having a first collector, a first emitter, and a first base; and a first output transistor having a second collector, a second base, and a second emitter coupled to the first collector;

providing a second cascode circuit consisting of:

a second input transistor having a third collector, a third emitter, and a third base; and a second output transistor having a fourth collector, a fourth base, and a fourth emitter coupled to the third collector;

connecting the first base to the fourth base;

connecting the second base to the third base;

configuring a fifth transistor as a common base (CB) amplifier and connecting it in series with the second transistor, the fifth transistor having a fifth collector, a fifth base and a fifth emitter connected to the second collector, such that a first output signal is generated at the fifth collector;

configuring a sixth transistor as a CB amplifier and connecting it in series with the fourth transistor, the sixth transistor having a sixth collector, a sixth base and a sixth emitter connected to the fourth collector, such that a second output signal is generated at the sixth collector;

receiving a first input signal and providing, responsively to the first input signal, substantially similar inputs to the first base and to the fifth base; and receiving a second input signal and providing, responsively to the second input signal, substantially similar inputs to the second base and to the sixth base.

The method preferably further includes:

providing a first DC input to the fifth base, such that the first DC input is proportional to a maximum collector-base potential; and providing a second DC input to the sixth base, such that the second DC input is proportional to the maximum collector-base potential.

Preferably, the respective first DC input is independent of the first input signal, and the second DC input is independent of the second input signal.

There is further provided, according to a preferred embodiment of the present invention, apparatus for compensating for losses in an electronic signal, including:

a first cascode circuit consisting of:

a first input transistor having a first collector, a first emitter, and a first base; and a first output transistor having a second collector, a second base, and a second emitter coupled to the first collector;

a second cascode circuit consisting of:

a second input transistor having a third collector, a third emitter, and a third base; and a second output transistor having a fourth collector, a fourth base, and a fourth emitter coupled to the third collector;

a first connection that connects the first base to the fourth base;

a second connection that connects the second base to the third base; and a circuit wherein the losses occur, the circuit being connected to the first base and the third base.

Preferably, the circuit includes a transmission line.

Alternatively or additionally, the circuit includes a filter.

There is preferably a first compensating circuit connected between the second emitter and the second base, and a second compensating circuit connected between the fourth emitter and the fourth base.

Preferably, the first and the second compensating circuits include substantially similar passive resistance-capacitance (RC) circuits which are adapted to selectively filter frequencies of the signal.

The apparatus preferably includes at least one compensating circuit coupled to at least one of the first cascode circuit and the second cascode circuit, the at least one compensating circuit being adapted to selectively filter frequencies of the signal.

There is further provided, according to a preferred embodiment of the present invention, a method for compensating for losses in an electronic signal, including:

providing a first cascode circuit consisting of:

a first input transistor having a first collector, a first emitter, and a first base; and a first output transistor having a second collector, a second base, and a second emitter coupled to the first collector;

providing a second cascode circuit consisting of:

a second input transistor having a third collector, a third emitter, and a third base; and a second output transistor having a fourth collector, a fourth base, and a fourth emitter coupled to the third collector;

connecting the first base to the fourth base;

connecting the second base to the third base; and coupling a circuit having the losses to the first base and the third base.

The circuit preferably includes a transmission line.

The circuit alternatively includes a filter.

The method preferably includes connecting a first compensating circuit between the second emitter and the second base, and connecting a second compensating circuit between the fourth emitter and the fourth base.

The first and the second compensating circuits preferably include substantially similar passive resistance-capacitance (RC) circuits which are adapted to selectively filter frequencies of the signal.

The method preferably includes coupling at least one compensating circuit to at least one of the first cascode circuit and the second cascode circuit, the at least one compensating circuit being adapted to selectively filter frequencies of the signal.

The present invention will be more fully understood from the following detailed description of the preferred embodiments thereof, taken together with the drawings, a brief description of which follows.

BRIEF DESCRIPTION OF THE DRAWINGS

FIGS. 3, 4, 5, and 6 show simulation graphs comparing properties of the amplifier of FIG. 1 with properties of a prior art cascode amplifier;

DETAILED DESCRIPTION OF PREFERRED EMBODIMENTS

Figure 1:
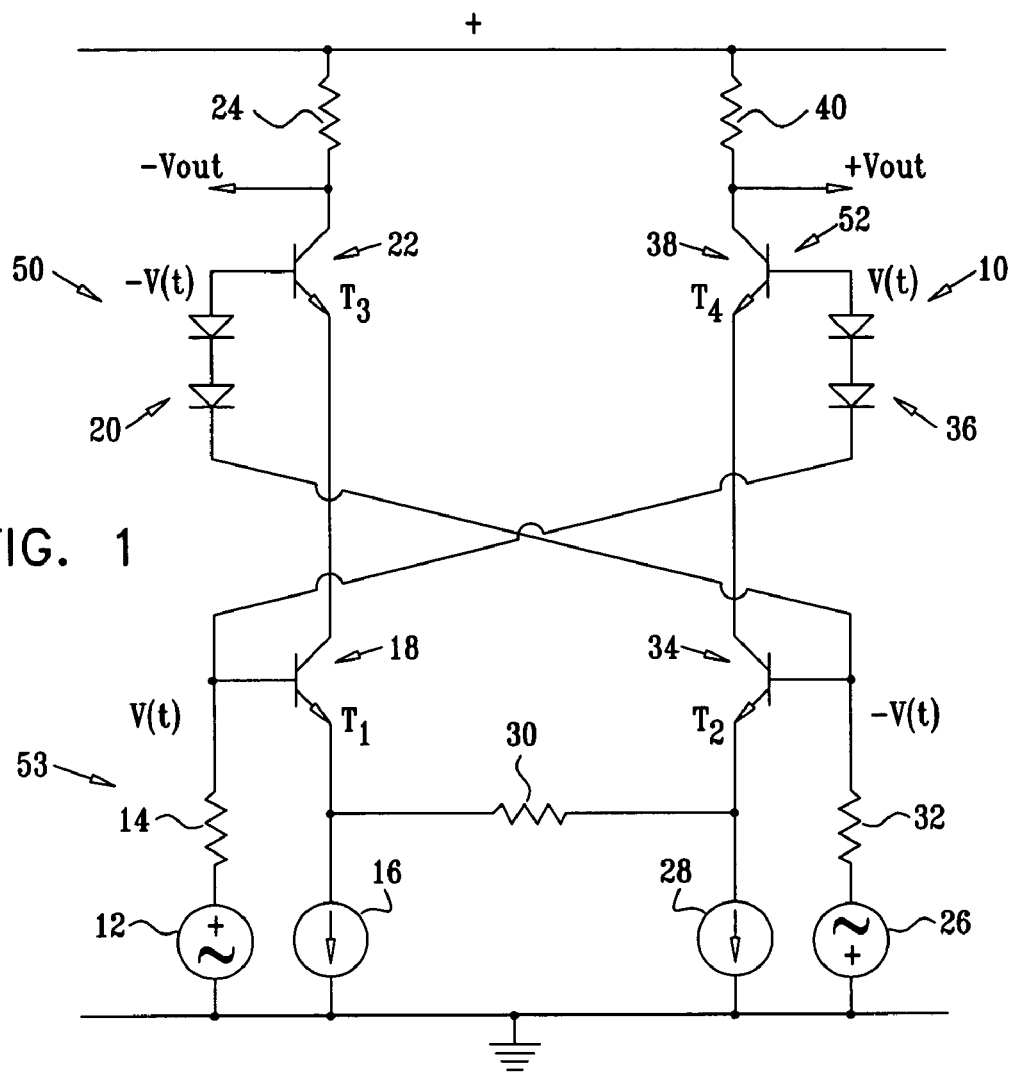
FIG. 1 is a schematic diagram of a differential amplifier, according to a preferred embodiment of the present invention.

Reference is now made to FIG. 1, which is a schematic diagram of a differential amplifier 10, according to a preferred embodiment of the present invention. Although the embodiments described hereinbelow make use of bipolar transistors, it will be apparent to those skilled in the art that the principles of the present invention may be implemented using transistors of other types, such as field effect transistors (FETs). Therefore, references to elements of bipolar transistors in the specification and the claims should be understood to include in their scope the equivalent elements of transistors of other types. In the specific case of a FET, for example, in the specification and in the claims, reference to a collector, a base, and an emitter of a bipolar transistor is to be taken to include reference respectively to a drain, a gate, and a source of a field effect transistor.

Amplifier 10 comprises a first cascode circuit 50 comprising transistors 18 and 22 connected in series, and a second cascode circuit 52 comprising transistors 34 and 38 connected in series. Transistors 18, 22, 34, and 38 are also herein referred to respectively as $T_1$, $T_3$, $T_2$, and $T_4$; $T_1$ and $T_2$ are also referred to as input transistors, and $T_3$ and $T_4$ are also referred to as output transistors. Transistors $T_1$, $T_2$, $T_3$, and $T_4$ preferably comprise bipolar transistors, although the principles of the present invention may be applied to other types of transistors, mutatis mutandis, such as FETS.

As described in more detail below, transistors $T_1$ and $T_2$ are configured to operate in a common emitter (CE) mode; transistors $T_3$ and $T_4$ are configured to operate in a common base (CB) mode. Except for differences described hereinbelow, circuits 50 and 52 are generally similar, comprising components that are substantially similar. Amplifier 10 is most preferably implemented as a part of an integrated circuit (IC).

The emitters of $T_1$ and $T_2$ are respectively connected to ground by constant current sources 16 and 28, and are also connected by a gain setting resistor 30, which by way of example has a value 1.6Ω. The collectors of $T_1$ and $T_2$ are respectively connected to the emitters of $T_3$ and $T_4$. The collectors of $T_3$ and $T_4$ are connected to a positive rail via resistors 24 and 40, which respectively generate a first differential output $-V_{out}(t)$ and a second differential output $V_{out}(t)$. Values for resistors 24, 40 by way of example are 41Ω. $T_1$ and the elements coupled to its base and emitter, together with $T_2$ and the elements coupled to its base and emitter, act as an input circuit 53 of amplifier 10.

The base of $T_1$ is cross-connected, via DC biasing elements 36, to the base of transistor $T_4$. Similarly, the base of $T_2$ is cross-connected via DC biasing elements 20 to the base of transistor $T_3$. Typically biasing elements 20 and 36 comprise one or more diodes connected in series, the number of diodes being chosen so that transistors $T_3$ and $T_4$ conduct and operate as amplifiers. However, it will be understood that biasing elements 20 and 36 may comprise any suitable DC generating circuitry with a low impedance.

A positive differential input signal 12 is input to the base of transistor $T_1$ via a resistor 14, generating an input voltage V(t), varying with time t, at the base of $T_1$. A negative differential input signal 26 is input to the base of transistor $T_2$ via a resistor 32, generating an input voltage −V(t), approximately 180° out of phase with V(t), at the base of $T_2$. By way of example values for resistors 14, 32, are 25Ω (equivalent to 50Ω and 50Ω in parallel).

Figure 2:
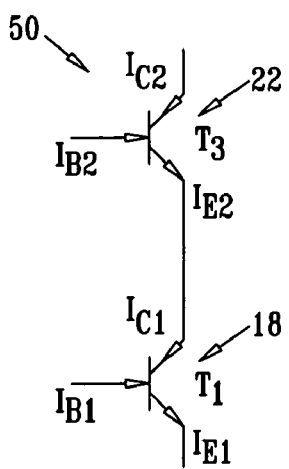
FIG. 2 is a schematic diagram illustrating currents flowing in transistors of a circuit comprised in the amplifier of FIG. 1.

FIG. 2 is a schematic diagram illustrating currents flowing in transistors $T_1$ and $T_3$ of circuit 50 (FIG. 1), according to a preferred embodiment of the present invention. Instantaneous parameters for transistors $T_1$ and $T_3$ are represented as shown in Table I:

TABLE I

| Transistor | Collector current | Base current | Emitter current | Collector-Emitter Gain |
|---|---|---|---|---|
| $T_1$ | $I_{C1}$ | $I_{B1}$ | $I_{E1}$ | $\alpha_1 = \dfrac{I_{C1}}{I_{E1}}$ |
| $T_3$ | $I_{C2}$ | $I_{B2}$ | $I_{E2}$ | $\alpha_2 = \dfrac{I_{C2}}{I_{E2}}$ |

Consideration of transistor $T_3$ gives:

$$I_{B2}=I_{E2}-I_{C2}=I_{E2}(1-\alpha_2) \qquad (1)$$

thus, since $I_{E2}=I_{C1}$, $$I_{B2}=I_{C1}(1-\alpha_2)=I_{E1}\alpha_1(1-\alpha_2) \qquad (2)$$

A substantially similar equation to equation (2) applies for the base current for transistor $T_4$.

Consideration of transistor $T_1$ gives:

$$I_{B1}=I_{E1}-I_{C1}=I_{E1}(1-\alpha_1) \qquad (3)$$

A substantially similar equation to equation (3) applies for the base current for transistor $T_2$.

Because circuits 50 and 52 have differential inputs, the two circuits operate in opposite phase to each other. Thus, since the bases of transistors $T_1$ and $T_4$ are connected, and since the two circuits are substantially similar, the current into the base of $T_1$, as given by equation (3), is reduced by the current given by equation (2):

$$I_R=I_{E1}(1-\alpha_1)-I_{E1}\alpha\alpha_1(1-\alpha_2)=I_{E1}(1-2\alpha_1+\alpha_1\alpha_2) \qquad (4)$$

where $I_R$ is the resultant current of differential input signal 12. A similar answer, in opposite phase, applies for the resultant current of differential input signal 26.

The reduction of base current illustrated by equation (4), compared to the base current given by equation (3), gives a corresponding increase in cascode circuit 50 current gain and impedance. It will be appreciated that the base current reduction is due to the cross-connection to circuit 52. Similarly, circuit 52 also has an increased current gain and impedance because of the cross-connection to circuit 50.

While the analysis above is generally correct, a more exact analysis of amplifier 10 needs to account for the effects of input signal frequency, as well as time delays introduced within the circuit. Results of such an analysis are shown below, in the graphs of FIGS. 3, 4, 5 and 6. The graphs are simulation results for amplifier 10 using bipolar junction transistors. The simulations were performed using a SiGe5AM design kit produced by IBM Corporation of Armonk, N.Y.

FIG. 3 shows simulation graphs comparing the admittance of amplifier 10 with the admittance of a prior art cascode amplifier not having the cross-connections described above, according to a preferred embodiment of the present invention. Hereinbelow, a prior art cascode amplifier not having cross-connections is also referred to as a "standard" cascode amplifier. The graphs of FIG. 3 show frequency effects of current gain and time delays referred to above, and plot ratios of components of admittances of amplifier 10 and a standard cascode amplifier. Graph A uses the ratio of the real parts, i.e., the ratio of the conductances;

graph B uses the ratio of the imaginary parts, i.e., the ratio of the susceptances. Both graphs plot the ratios vs. a frequency ratio $$\frac{f}{f_{max}},$$

components of which are defined below. In the graphs
$Y_{dif}$ is an input admittance of amplifier 10,
$Y_0$ is an input admittance for a standard cascode amplifier;
f is the input frequency, and
$f_{max}$ is the frequency at which the overall gain of amplifier 10 is approximately unity, corresponding to a maximum effective working frequency for the amplifier. At $f_{max}$, β (the collector-base current gain) for all transistors is approximately 1.

Simulation graphs A and B coincide with graphs that can account for the frequency effects and time delays by assuming that more exact expressions for $\alpha_1$ and for $\alpha_2$ in equation (4) are given by:

$$\alpha_1 = \alpha_2 = \alpha\left(\frac{f}{f_{max}}\right) = \frac{\alpha_0}{1 + i\left(\frac{f}{f_{max}}\right)} e^{-i\tau \frac{f}{f_{max}}} \quad (5)$$

where $$\alpha\left(\frac{f}{f_{max}}\right)$$

is the collector-emitter current gain at frequency f;
$\alpha_0$ is a low-frequency collector-emitter current gain, typically approximately equal to 0.98; and
τ is a normalized time delay between the collector and base currents, by way of example assumed equal to 0.2.

Graph A shows that the input conductance for amplifier 10 is negative, with an absolute value for the ratio of the conductances for most of the range of frequencies of the graph significantly less than 1. Thus, the real part of the input impedance of amplifier 10 is negative, and the absolute impedance is significantly greater than the absolute impedance of a standard cascode amplifier. The negative part of the input impedance contributes to increasing the bandwidth of amplifier 10 and improving the flatness of the frequency response of the amplifier. The improvements are not at the expense of causing instability in amplifier 10, since there is gain in a positive feedback loop which has a phase shift less then 180°. The positive feedback loop is formed by a source resistance Rg and an emitter junction resistance Re of an input transistor. Referring back to FIG. 1, resistors 14 and 32 are source resistors, and transistors $T_1$ and $T_2$ are input transistors.

The positive feedback loop gain T(Rg,f) is a function of Rg, Re, frequency f and current gain α, as given by equation (6):

$$T(Rg, f) = \frac{Rg}{Re}\left(1 - \alpha\left(\frac{f}{f_{max}}\right)\right)^2 \quad (6)$$

where $$\alpha\left(\frac{f}{f_{max}}\right)$$

is as defined by equation (5), and $$Re = \frac{V_T}{I_0},$$

where VT is the thermal voltage of the junction, and $I_0$ is the DC current of the input transistor.

The closed loop gain G(Rg,f) is given by equation (7):

$$G(Rg, f) = \frac{1}{1 + T(Rg, f)} \quad (7)$$

For all cases |G(Rg,f)|<2 and phase shift <120°. Typically, for amplifier 10, |G(Rg,f)|<1.4 and phase shift <90°.

Graph B shows that the ratio of the input susceptances increases towards 1 as the input frequency increases. However, in a main part of the frequency band an input capacitance of cross-connected cascode amplifier 10 is much less than for a standard cascode amplifier. The reduction in input capacitance further contributes to the increased input impedance and increase bandwidth of amplifier 10.

FIG. 4 shows schematic graphs comparing properties of amplifier 10 with a standard cascode amplifier, according to a preferred embodiment of the present invention. The graphs show different normalized voltage gains vs.

$$\frac{f}{f_{max}}.$$

Graph C shows the voltage gain of cross-connected cascode amplifier 10 and graph D shows the voltage gain of a standard amplifier. It is seen from the graphs that the gain of amplifier 10 is substantially flatter than that of the standard amplifier. Furthermore, the bandwidth of amplifier 10 is approximately three times greater than that of the standard amplifier, as shown by the 3 dB points of each amplifier.

Graph E shows the voltage gain of input circuit 53 of amplifier 10 and graph F shows the voltage gain of the input circuit of a standard amplifier. The graphs show that the voltage gain of input circuit 53 of amplifier 10 is significantly greater over the whole frequency range than that of a standard input circuit.

Figure 5:
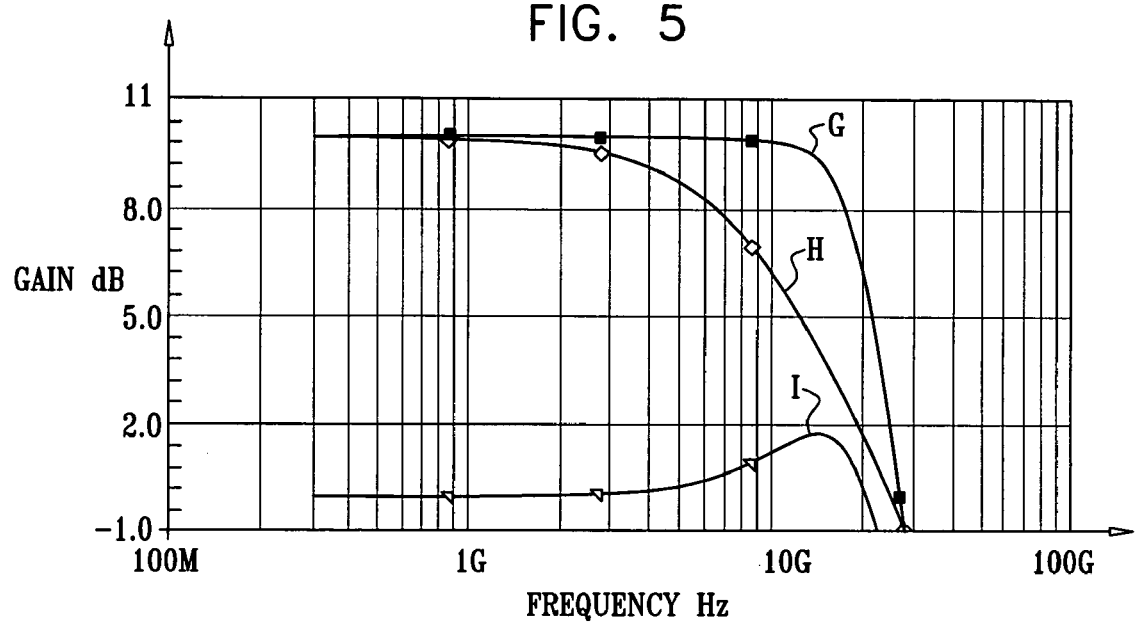

FIG. 5 shows further graphs comparing the properties of amplifier 10 with a standard cascode amplifier, according to a preferred embodiment of the present invention. The graphs show actual voltage gains vs. frequency for a simulation of amplifier 10 and a standard amplifier. Graphs G and H show voltage gains respectively for amplifier 10 and for a standard amplifier. Graph I shows the voltage gain for input circuit 53 of amplifier 10. Graphs G, H, and I correspond respectively with graphs C, D, and E of FIG. 4.

Figure 6:
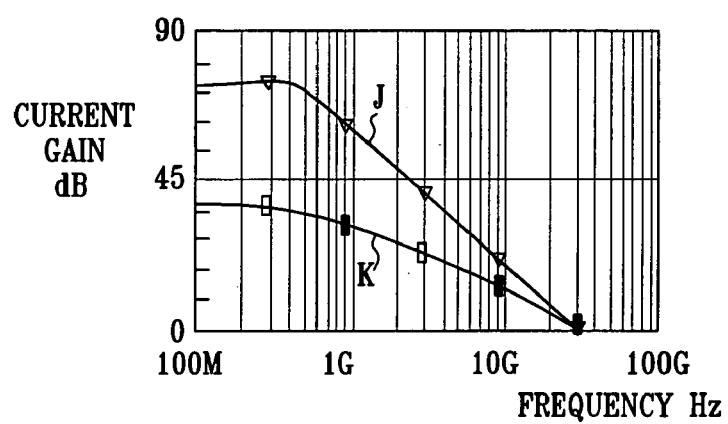

FIG. 6 shows further graphs comparing the properties of amplifier 10 with a standard cascode amplifier, according to a preferred embodiment of the present invention. The graphs show actual current gains vs. frequency for a simulation of amplifier 10 and a standard amplifier. Graph J shows current gain for amplifier 10. Graph K shows the current gain for a standard amplifier. The graphs show that the current gain of amplifier 10 is significantly greater over substantially the whole frequency range compared with that of a standard amplifier.

In an amplifier constructed according to the circuit of FIG. 1, using bipolar junction technology (BJT), a DC current gain is approximately 40 dB, and $f_{max}$ is approximately 40 GHz. For a DC current of 5 mA, the voltage gain is approximately 10.7 dB, the DC current gain is approximately 68 dB, and a bandwidth of the amplifier is approximately 18.5 GHz. In comparison, a prior art amplifier has DC current gain approximately equal to 38 dB, and a bandwidth of approximately 8.3 GHz.

Figure 7:
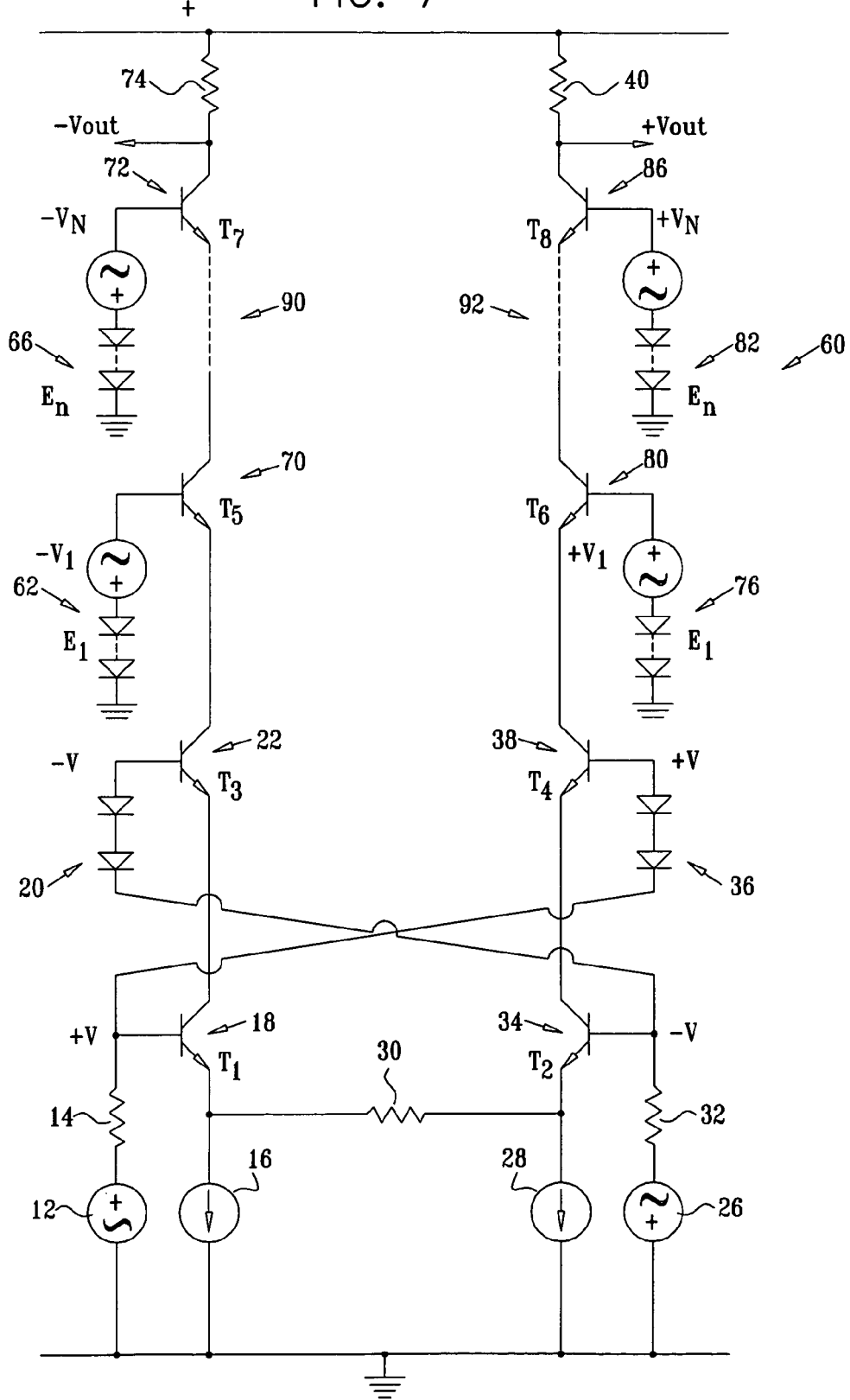
FIG. 7 is a schematic diagram of a differential amplifier, according to an alternative preferred embodiment of the present invention.

FIG. 7 is a schematic diagram of a differential amplifier 60, according to an alternative preferred embodiment of the present invention. Apart from the differences described below, the operation of amplifier 60 is generally similar to that of amplifier 10 (FIG. 1), such that elements indicated by the same reference numerals in both amplifiers 60 and 10 are generally identical in construction and in operation. Instead of transistors $T_3$ and $T_4$ being connected to resistors 24 and 40 (FIG. 1), each transistor is connected to one or more transistors coupled in series, each of the transistors being coupled in a CB configuration. By way of example, $T_3$ is coupled to a first transistor $T_5$ and a final transistor $T_7$, $T_7$ being connected to a collector resistor 74, to form a first multiple cascode circuit 90. Similarly $T_4$ is coupled to a first transistor $T_6$, a final transistor $T_8$, and a collector resistor 88, to form a second multiple cascode circuit 92. In a general case, there are N multi-level CB transistors in circuit 90, and N multi-level CB transistors in circuit 92, where N is a whole number. In each circuit, the current through each CB transistor of the circuit is effectively the same, since there are relatively small currents flowing through the base of each transistor.

In amplifier 60 the DC levels to the bases of each transistor $T_5, \ldots, T_7$ and $T_6, \ldots, T_8$ may be set separately and independently, by respective DC biasing elements 62, 66, 76, and 82. Elements 62, 66, 76, and 82 are preferably substantially similar to elements 20 and 36, described above. Most preferably, the DC biasing elements are selected so that the CB coupled transistors have substantially similar relative DC operating points, and so that there are substantially equal collector-emitter or collector-base voltage drops for each stage. A DC voltage shift $E_k$ for the base of a k-level stage is preferably set in terms of a maximum allowable collector-base voltage $E_{max}$ of the transistors forming amplifier 60, most preferably according to equation (8):

$$E_k = (k+1)(E_{max} - 2V) \quad (8)$$

where k corresponds to a number indicative of a position of each stage in the sequence of transistors in circuit 90, and also in circuit 92, and V is an amplitude of the differential input AC signal voltage to amplifier 10.

Preferably, the AC level to each of the CB coupled transistors in circuit 90 is set as a function of voltage V(t) input to transistor $T_1$, and the AC level to each of the CB coupled transistors in circuit 92 is set as the same function of voltage −V(t) input to transistor $T_2$. Preferably, the AC level for each stage is set according to equation (9):

$$V_k = -(2k+1)V \quad (9)$$

where V and k are as defined in equation (8), and the "−" sign indicates that $V_k$ has an opposite phase to the input voltage V.

Typically, to generate values of $V_k$ as defined by equation (9), outputs from the collectors of final transistors $T_7$ and $T_8$ are used, by methods which will be apparent to those skilled in the art.

Figure 8:
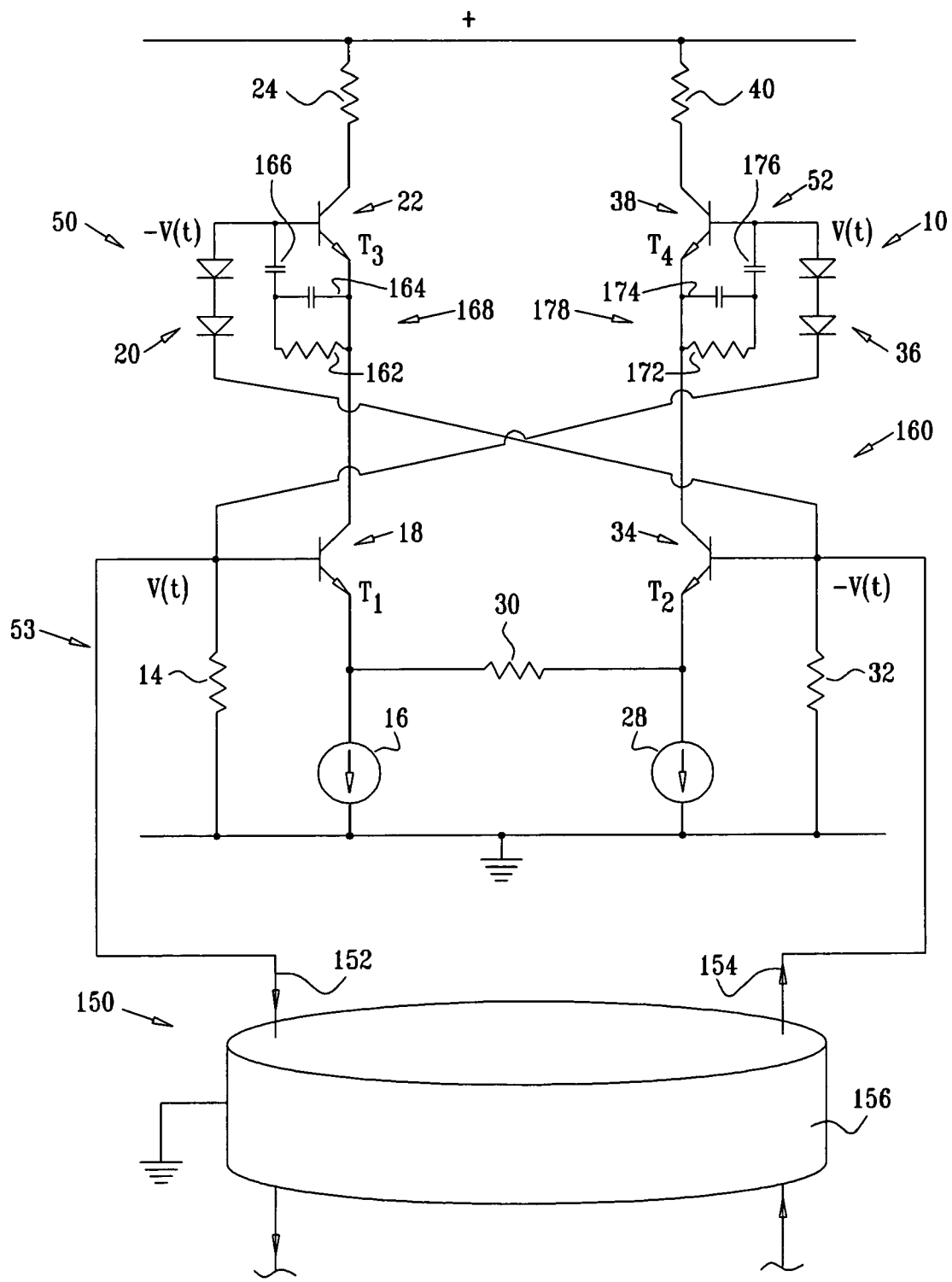
FIG. 8 is a schematic diagram of a transmission line system, according to a preferred embodiment of the present invention.

FIG. 8 is a schematic diagram of a transmission line system, according to a preferred embodiment of the present invention. A differential transmission line 150, comprises a pair of conductors 152 and 154 and a common ground 156. Line 150 is most preferably implemented as part of an integrated circuit (IC). Line 150 is coupled to a compensating circuit 160, which is also most preferably implemented in the same IC as the transmission line.

Apart from the differences described below, circuit 160 is generally similar to amplifier 10 (FIG. 1), such that elements indicated by the same reference numerals in both circuit 160 and amplifier 10 are generally identical in construction and in operation. In contrast to amplifier 10, in circuit 160 resistors 14 and 32 are coupled directly between the bases of transistors T1 and T2 and ground. A first RC circuit 168 comprises a resistor 164 in parallel with a capacitor 164. A decoupling capacitor 166 is coupled in series with the parallel combination to form circuit 168, which is connected between the emitter and the base of transistor T3. A second RC circuit 178, comprising decoupling capacitors 176 and 174 and a resistor 172, is substantially identical to circuit 168, and is connected between the emitter and the base of transistor T4.

Conductor 152 is connected directly to the base of transistor T1, and conductor 154 is connected directly to the base of transistor T2. Thus, resistors 14 and 32 act as terminating resistors of conductors 152 and 154 respectively.

There may be cases where a transmission line has a relatively large length and losses which cannot be compensated by a single compensating circuit 160. In such a case the line may be divided into two or more parts, each substantially similar to line 150, and each part may be terminated by a compensating circuit substantially similar to circuit 160. In some embodiments a termination resistor may be used on a final part.

Circuit 160 compensates for the losses incurred in line 150 by applying a negative input conductance to the line. Incorporating RC circuits 168 and 178 into circuit 160 increases the negative conductance, in a broad frequency band, that is generated by circuit 160 and synthesizes input impedance dependencies of amplifier 10 to compensate losses in transmission line 150.

Figure 9:
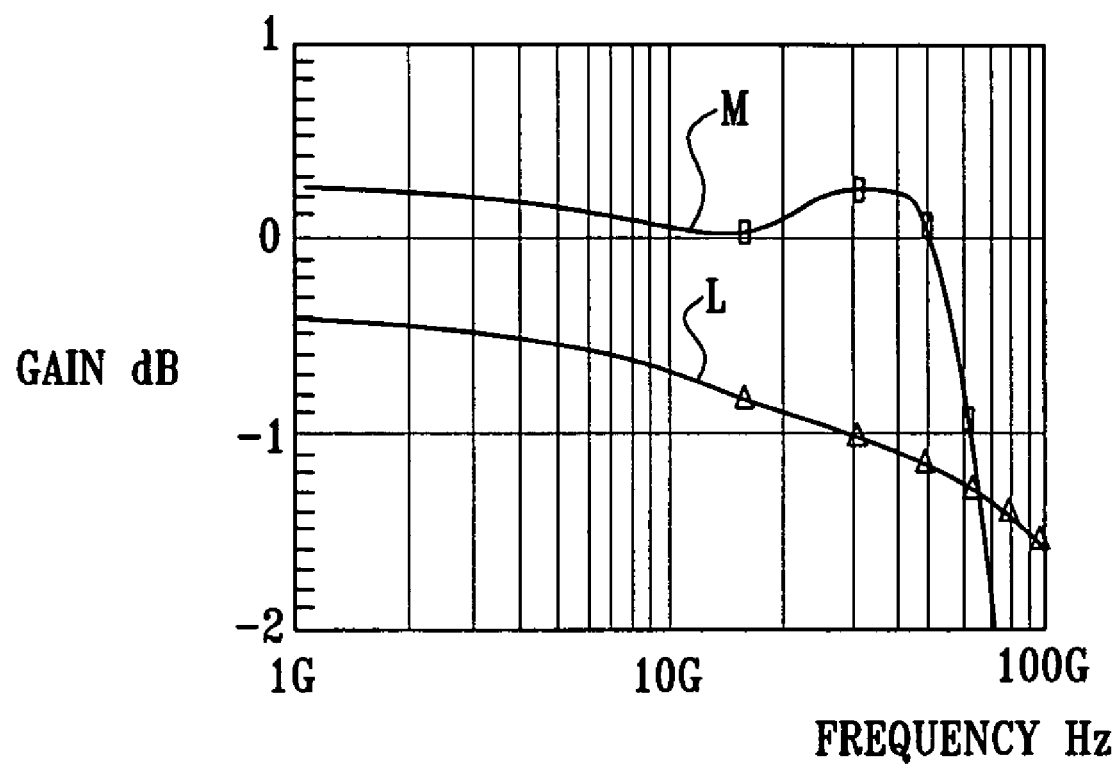
FIG. 9 shows simulation graphs comparing properties of the system of FIG. 8 with a prior art transmission line.

FIG. 9 shows graphs of transfer functions of transmission line 150. A graph L shows the gain vs. frequency for line 150 when it is not coupled to circuit 160. A graph M shows the gain vs. frequency for line 150 coupled to circuit 160. Graph M shows that losses in transmission lines such as line 150 are substantially totally compensated in a frequency band up to approximately 50 GHz.

The description for FIG. 8 and FIG. 9 relates to compensating losses occurring in signals in a transmission line by coupling the line to circuit 160. It will be appreciated that signal losses occurring in other active or passive electronic elements or combinations of elements may be compensated for in a generally similar manner, because of the negative conductance properties of circuit 160. For example, if instead of coupling transmission line 150 to circuit 160, a filter is coupled to the circuit, the circuit will compensate for losses similar to those of the transmission line that occur in the filter. Those skilled in the art will be familiar with other circuit elements or combinations thereof that have signal losses which may be compensated for by coupling to circuits such as circuit 160; all such circuit elements coupled to such a circuit are assumed to be comprised within the scope of the present invention.

It will be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

We claim:

1. A differential amplifier comprising:
   a first cascode circuit comprising:
      a first input transistor comprising a first collector, a first emitter, and a first base; and
      a first output transistor comprising a second collector, a second base, and a second emitter coupled to the first collector;
   a second cascode circuit comprising:
      a second input transistor comprising a third collector, a third emitter, and a third base; and
      a second output transistor comprising a fourth collector, a fourth base, and a fourth emitter coupled to the third collector;
   a first connection that connects the first base to the fourth base; and
   a second connection that connects the second base to the third base, wherein the first connection comprises a first direct current (DC) biasing circuit that generates a first DC potential difference between the first base and the fourth base, and wherein the second connection comprises a second DC biasing circuit that generates a second DC potential difference between the second base and the third base.

2. The amplifier according to claim 1, further comprising an input circuit which generates a first input signal input to the first base, and a second input signal substantially 180° out of phase with the first signal, and input to the third base, and wherein a first differential signal is output at the second collector, and a second differential signal is output at the fourth collector.

3. The amplifier according to claim 1, further comprising an input circuit which generates a first input signal, input to the first base, and a second input signal input to the third base, such that a first emitter current of the first emitter is reduced in response to the second input signal, and such that a second emitter current of the third emitter is reduced in response to the first input signal, and wherein a first differential signal is output at the second collector, and a second differential signal is output at the fourth collector.

4. The amplifier according to claim 1, further comprising:
   a plurality of first series transistors, configured as common base (CB) amplifiers and connected in a first series with the first output transistor, each of the first series transistors comprising a respective fifth collector, a respective fifth base and a respective fifth emitter, the plurality of the first series transistors comprising:
      a fifth transistor, connected at an initial position in the first series, such that the fifth emitter of the fifth transistor is connected to the second collector; and
      one or more sixth transistors, connected subsequent to the fifth transistor in the first series, such that the fifth emitter of each of the sixth transistors is connected to the fifth collector of a preceding one of the first series transistors, and a first output signal is generated at the fifth collector of a final one of the sixth transistors in the first series;
   a plurality of second series transistors, configured as CB amplifiers and connected in a second series with the second output transistor, each of the second series transistors comprising a respective sixth collector, a respective sixth base and a respective sixth emitter, the plurality of the second series transistors comprising:
      a seventh transistor, connected at an initial position in the second series, such that the sixth emitter of the seventh transistor is connected to the fourth collector; and
      one or more eighth transistors, connected subsequent to the seventh transistor in the second series, such that the sixth emitter of each of the eighth transistors is connected to the sixth collector of a preceding one of the second series transistors, and a second output signal is generated at the sixth collector of a final one of the eighth transistors in the second series;
   a first input circuit, which is coupled to receive a first input signal and to provide, responsively to the first input signal, respective inputs to the first base and to the fifth base of each of the first series transistors, such that each of the respective inputs to the first series transistors is proportional to the first input signal in a proportion responsive to a position of each of the first series transistors in the first series; and
   a second input circuit, which is coupled to receive a second input signal and to provide, responsively to the second input signal, respective inputs to the third base and to the sixth base of each of the second series transistors, such that each of the respective inputs to the second series transistors is proportional to the second input signal in a proportion responsive to a position of each of the second series transistors in the second series.

5. The amplifier according to claim 4, further comprising:
   first direct current (DC) biasing circuits which provide respective first DC inputs to the fifth bases of the first series transistors, such that each of the respective first DC inputs is proportional to a maximum collector-base potential in a proportion responsive to a position of each of the first series transistors in the first series; and
   second DC biasing circuits which provide respective second DC inputs to the seventh bases of the second series transistors, such that each of the respective second DC inputs is proportional to the maximum collector-base potential in a proportion responsive to the position of each of the second series transistors in the second series.

6. The amplifier according to claim 5, wherein the respective first DC inputs are independent of the first input signal, and wherein the respective second DC inputs are independent of the second input signal.

7. The amplifier according to claim 1, further comprising:
   a fifth transistor, configured as a common base (CB) amplifier and connected in series with the first output transistor, die fifth transistor comprising a fifth collector, a fifth base and a fifth emitter connected to the second collector, such that a first output signal is generated at the fifth collector;
   a sixth transistor, configured as a CB amplifier and connected in series with the second output transistor, the sixth transistor comprising a sixth collector, a sixth base and a sixth emitter connected to the fourth collector, such that a second output signal is generated at the sixth collector;
a first input circuit, which is coupled to receive a first input signal and to provide, responsively to the first input signal, substantially similar inputs to the first base and to the fifth base; and
a second input circuit, which is coupled to receive a second input signal and to provide, responsively to the second input signal, substantially similar inputs to the third base and to the sixth base.

8. The amplifier according to claim 7, further comprising:
a first direct current (DC) biasing circuit which provides a first DC input to the fifth base, such that the first DC input is proportional to a maximum collector-base potential; and
a second DC biasing circuit which provides a second DC input to the sixth base, such that the second DC input is proportional to the maximum collector-base potential.

9. The amplifier according to claim 8, wherein the first DC input is independent of the first input signal, and wherein the second DC input is independent of the second input signal.

10. A method for amplifying a differential signal, comprising:
providing a first cascode circuit comprising:
a first input transistor comprising a first collector, a first emitter, and a first base; and
a first output transistor comprising a second collector, a second base, and a second emitter coupled to the first collector;
providing a second cascode circuit comprising:
a second input transistor comprising a third collector, a third emitter, and a third base; and
a second output transistor comprising a fourth collector, a fourth base, and a fourth emitter coupled to the third collector;
connecting the first base to the fourth base;
connecting the second base to the third base;
inputting the differential signal to the first base and the third base; and
outputting an amplified differential signal from the second collector and the fourth collector.

11. The method according to claim 10, wherein connecting the first base to the fourth base comprises generating a first direct current (DC) potential difference between the first base and the fourth base, and wherein connecting the second base to the third base comprises generating a second DC potential difference between the second base and the third base.

12. The method according to claim 10, wherein the differential signal comprises a first input signal coupled to the first base, and a second input signal substantially 180° out of phase with the first signal input coupled to the third base.

13. The method according to claim 12, further comprising reducing a first emitter current of the first emitter in response to the second input signal, and reducing a second emitter current of the third emitter in response to the first input signal.

14. A method for amplifying a differential signal, comprising:
providing a first cascade circuit comprising:
a first input transistor comprising a first collector, a first emitter, and a first base; and
a first output transistor comprising a second collector, a second base, and a second emitter coupled to the first collector;
providing a second cascode circuit comprising:
a second input transistor comprising a third collector, a third emitter, and a third base; and
a second output transistor comprising a fourth collector, a fourth base, and a fourth emitter coupled to the third collector;
connecting the first base to the fourth base;
connecting the second base to the third base;
configuring a plurality of first series transistors as first common base (CB) amplifiers and connecting the first CB amplifiers in a first series with the first output transistor, each of the first series transistors comprising a respective fifth collector, a respective fifth base and a respective fifth emitter, the plurality of the first series transistors comprising:
a first-series-initial transistor, connected at an initial position in the first series, such that the fifth emitter of the first-series-initial transistor is connected to the second collector; and
one or more first-series-subsequent transistors, connected subsequent to the first-series-initial transistor, such that the fifth emitter of each of the first-series-subsequent transistors is connected to the fifth collector of a preceding one of the first-series-subsequent transistors, and a first output signal is generated at the fifth collector of a final one of the first-series-subsequent transistors;
configuring a plurality of second series transistors as second CB amplifiers and connecting the second CB amplifiers in a second series with the second output transistor, each of the second series transistors comprising a respective sixth collector, a respective sixth base and a respective sixth emitter, the plurality of the second series transistors comprising:
a second-series-initial transistor, connected at an initial position in the second series, such that the sixth emitter of the second-series-initial transistor is connected to the fourth collector; and
one or more second-series-subsequent transistors, connected subsequent to the second-series-initial transistor in the second series, such that the sixth emitter of each of the second-series-subsequent transistors is connected to the sixth collector of a preceding one of the second-series-subsequent transistors in the second series, and a second output signal is generated at the sixth collector of a final one of the second-series-subsequent transistors in the second series;
receiving a first input signal and providing, responsively to the first input signal, respective inputs to the first base and to the fifth base of each of the first series transistors, such that each of the respective inputs to the first series transistors is proportional to the first input signal in a proportion responsive to a position of each of the first series transistors in the first series; and
receiving a second input signal and providing, responsively to the second input signal, respective inputs to the third base and to the sixth base of each of the second series transistors, such that each of the respective inputs to the second series transistors is proportional to the second input signal in a proportion responsive to a position of each of the second series transistors in the second series.

15. The method according to claim 14, further comprising:
providing respective first DC inputs to the fifth bases of each of the first series transistors, such that each of the respective first DC inputs is proportional to a maximum collector-base potential in a proportion responsive to a position of each of the first series transistors in the first series; and
providing respective second DC inputs to the seventh bases of each of the second series transistors, such that each of the respective second DC inputs is proportional to the maximum collector-base potential in a proportion responsive to the position of each of the second series transistors in the second series.

16. The method according to claim 15, wherein the respective first DC inputs are independent of the first input signal, and wherein the respective second DC inputs are independent of the second input signal.

17. A method for amplifying a differential signal, comprising:
providing a first cascode circuit comprising:
a first input transistor comprising a first collector, a first emitter, and a first base; and
a first output transistor comprising a second collector, a second base, and a second emitter coupled to the first collector;
providing a second cascode circuit comprising:
a second input transistor comprising a third collector, a third emitter, and a third base; and
a second output transistor comprising a fourth collector, a fourth base, and a fourth emitter coupled to the third collector;
connecting the first base to the fourth base;
connecting the second base to the third base;
configuring a fifth transistor as a common base (CB) amplifier and connecting it in series with the second transistor, the fifth transistor comprising a fifth collector, a fifth base and a fifth emitter connected to the second collector, such that a first output signal is generated at the fifth collector;
configuring a sixth transistor as a CB amplifier and connecting it in series with the fourth transistor, the sixth transistor comprising a sixth collector, a sixth base and a sixth emitter connected to the fourth collector, such chat a second output signal is generated at the sixth collector;
receiving a first input signal and providing, responsively to the first input signal, substantially similar inputs to the first base and to the fifth base; and
receiving a second input signal and providing, responsively to the second input signal, substantially similar inputs to the second base and to the sixth base.

18. The method according to claim 17, further comprising:
providing a first DC input to the fifth base, such that the first DC input is proportional to a maximum collector-base potential; and
providing a second DC input to the sixth base, such that the second DC input is proportional to the maximum collector-base potential.

19. The method according to claim 18, wherein the respective first DC input is independent of the first input signal, and wherein the second DC input is independent of the second input signal.

20. Apparatus for compensating for losses in an electronic signal, comprising:
a first cascode circuit comprising:
a first input transistor comprising a first collector, a first emitter, and a first base; and
a first output transistor comprising a second collector, a second base, and a second emitter coupled to the first collector;
a second cascode circuit comprising:
a second input transistor comprising a third collector, a third emitter, and a third base; and
a second output transistor comprising a fourth collector, a fourth base, and a fourth emitter coupled to the third collector;
a first connection that connects the first base to the fourth base;
a second connection that connects the second base to the third base;
a circuit wherein the losses occur, the circuit being connected to the first base and the third base; and
a first compensating circuit connected between the second emitter and the second base, and a second compensating circuit connected between the fourth emitter and the fourth base.

21. The apparatus according to claim 20, wherein the first and the second compensating circuits comprise substantially similar passive resistance-capacitance (RC) circuits which are adapted to selectively filter frequencies of the signal.

22. The apparatus according to claim 20, further comprising at least one compensating circuit coupled to at least one of the first cascode circuit and the second cascode circuit, the at least one compensating circuit being adapted to selectively filter frequencies of the signal.

23. A method for compensating for losses in an electronic signal, comprising:
providing a first cascode circuit comprising:
a first input transistor comprising a first collector, a first emitter, and a first base; and
a first output transistor comprising a second collector, a second base, and a second emitter coupled to the first collector;
providing a second cascode circuit comprising:
a second input transistor comprising a third collector, a third emitter, and a third base; and
a second output transistor comprising a fourth collector, a fourth base, and a fourth emitter coupled to the third collector;
connecting the first base to the fourth base;
connecting the second base to the third base;
coupling a circuit having the losses to the first base and the third base; and
connecting a first compensating circuit between the second emitter and the second base, and connecting a second compensating circuit between the fourth emitter and the fourth base.

24. The method according to claim 23, wherein the first and the second compensating circuits comprise substantially similar passive resistance-capacitance (RC) circuits which are adapted to selectively filter frequencies of the signal.

25. The method according to claim 23, further comprising coupling at least one compensating circuit to at least one of the first cascade circuit and the second cascade circuit, the at least one compensating circuit being adapted to selectively filter frequencies of the signal.

* * * * *